United States Patent
Chang et al.

(10) Patent No.: US 12,400,962 B2
(45) Date of Patent: Aug. 26, 2025

(54) LINER-FREE CONDUCTIVE STRUCTURES WITH ANCHOR POINTS

(71) Applicant: TAIWAN SEMICONDUCTOR MANUFACTURING CO., LTD., Hsinchu (TW)

(72) Inventors: Hsu-Kai Chang, Hsinchu (TW); Keng-Chu Lin, Hsinchu (TW); Sung-Li Wang, Zhubei (TW); Shuen-Shin Liang, Hsinchu (TW); Chia-Hung Chu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/232,722

(22) Filed: Aug. 10, 2023

(65) Prior Publication Data

US 2023/0387017 A1 Nov. 30, 2023

Related U.S. Application Data

(60) Continuation of application No. 17/815,730, filed on Jul. 28, 2022, now Pat. No. 11,837,544, which is a
(Continued)

(51) Int. Cl.
*H01L 23/532* (2006.01)
*H01L 21/768* (2006.01)
*H01L 23/522* (2006.01)

(52) U.S. Cl.
CPC .. *H01L 23/53257* (2013.01); *H01L 21/76883* (2013.01); *H01L 23/5226* (2013.01); *H01L 23/53242* (2013.01)

(58) Field of Classification Search
CPC .......... H01L 21/76883; H01L 23/5226; H01L 23/53242; H01L 21/76844;
(Continued)

(56) References Cited

U.S. PATENT DOCUMENTS

| | | | |
|---|---|---|---|
| 5,930,669 A | 7/1999 | Uzoh | |
| 6,011,311 A * | 1/2000 | Hsing | ................. H01L 23/5226 257/E23.145 |

(Continued)

FOREIGN PATENT DOCUMENTS

| | | |
|---|---|---|
| CN | 1905194 A | 1/2007 |
| CN | 101515562 A | 8/2009 |

(Continued)

OTHER PUBLICATIONS

Office Action directed to related Korean Patent Application No. 10-2020-0138237, mailed May 17, 2022; 5 pages.
(Continued)

*Primary Examiner* — Phat X Cao
(74) *Attorney, Agent, or Firm* — Sterne, Kessler, Goldstein & Fox P.L.L.C.

(57) ABSTRACT

The present disclosure describes a method for forming liner-free or barrier-free conductive structures. The method includes depositing an etch stop layer on a cobalt contact disposed on a substrate, depositing a dielectric on the etch stop layer, etching the dielectric and the etch stop layer to form an opening that exposes a top surface of the cobalt contact, and etching the exposed top surface of the cobalt contact to form a recess in the cobalt contact extending laterally under the etch stop layer. The method further includes depositing a ruthenium metal to substantially fill the recess and the opening, and annealing the ruthenium metal to form an oxide layer between the ruthenium metal and the dielectric.

20 Claims, 17 Drawing Sheets

Related U.S. Application Data division of application No. 16/936,335, filed on Jul. 22, 2020, now Pat. No. 11,929,327.

(60) Provisional application No. 62/967,278, filed on Jan. 29, 2020.

(58) Field of Classification Search
CPC ......... H01L 21/76805; H01L 21/76834; H01L 21/76888
See application file for complete search history.

(56) References Cited

U.S. PATENT DOCUMENTS

| | | | |
|---|---|---|---|
| 6,037,257 A | 3/2000 | Chiang et al. | |
| 6,040,243 A | 3/2000 | Li et al. | |
| 6,160,315 A | 12/2000 | Chang et al. | |
| 6,249,055 B1 | 6/2001 | Dubin | |
| 6,506,668 B1 | 1/2003 | Woo et al. | |
| 6,713,373 B1 | 3/2004 | Omstead | |
| 6,806,192 B2 | 10/2004 | Lin et al. | |
| 7,651,943 B2 | 1/2010 | Yu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,287,138 B2 | 3/2016 | Wang et al. | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,543,248 B2* | 1/2017 | Xu | H01L 21/76846 |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,290,535 B1 | 5/2019 | Ho et al. | |
| 10,629,480 B2 | 4/2020 | Chen et al. | |
| 11,837,544 B2* | 12/2023 | Chang | H01L 23/5226 |
| 2002/0173142 A1 | 11/2002 | Vanhaelemeersch et al. | |
| 2007/0032015 A1 | 2/2007 | Itoh et al. | |
| 2008/0224235 A1 | 9/2008 | Lavoie et al. | |
| 2009/0209099 A1 | 8/2009 | Yu et al. | |
| 2009/0304914 A1 | 12/2009 | Nalla et al. | |
| 2014/0183738 A1 | 7/2014 | Jezewski et al. | |
| 2014/0299988 A1 | 10/2014 | Cabral, Jr. et al. | |
| 2015/0171007 A1* | 6/2015 | Huang | H01L 21/02271 257/774 |
| 2018/0040734 A1 | 2/2018 | Chang et al. | |
| 2019/0164887 A1 | 5/2019 | Wang et al. | |
| 2019/0287851 A1* | 9/2019 | Chen | H01L 21/76814 |
| 2021/0233861 A1 | 7/2021 | Chang et al. | |
| 2023/0016100 A1 | 1/2023 | Chang et al. | |
| 2024/0021474 A1 | 1/2024 | Hsieh et al. | |

FOREIGN PATENT DOCUMENTS

| | | |
|---|---|---|
| DE | 102017127206 A1 | 12/2018 |
| JP | 5234718 B2 | 7/2013 |
| KR | 20060076010 A | 7/2006 |
| KR | 20180015563 A | 2/2018 |
| KR | 20190064400 A | 6/2019 |
| TW | 200428581 A | 12/2004 |
| TW | 201926545 A | 7/2019 |
| TW | 201941362 A | 10/2019 |

OTHER PUBLICATIONS

Office Action directed to related Korean Patent Application No. 10-2020-0138237, mailed Nov. 26, 2022; 6 pages.

* cited by examiner

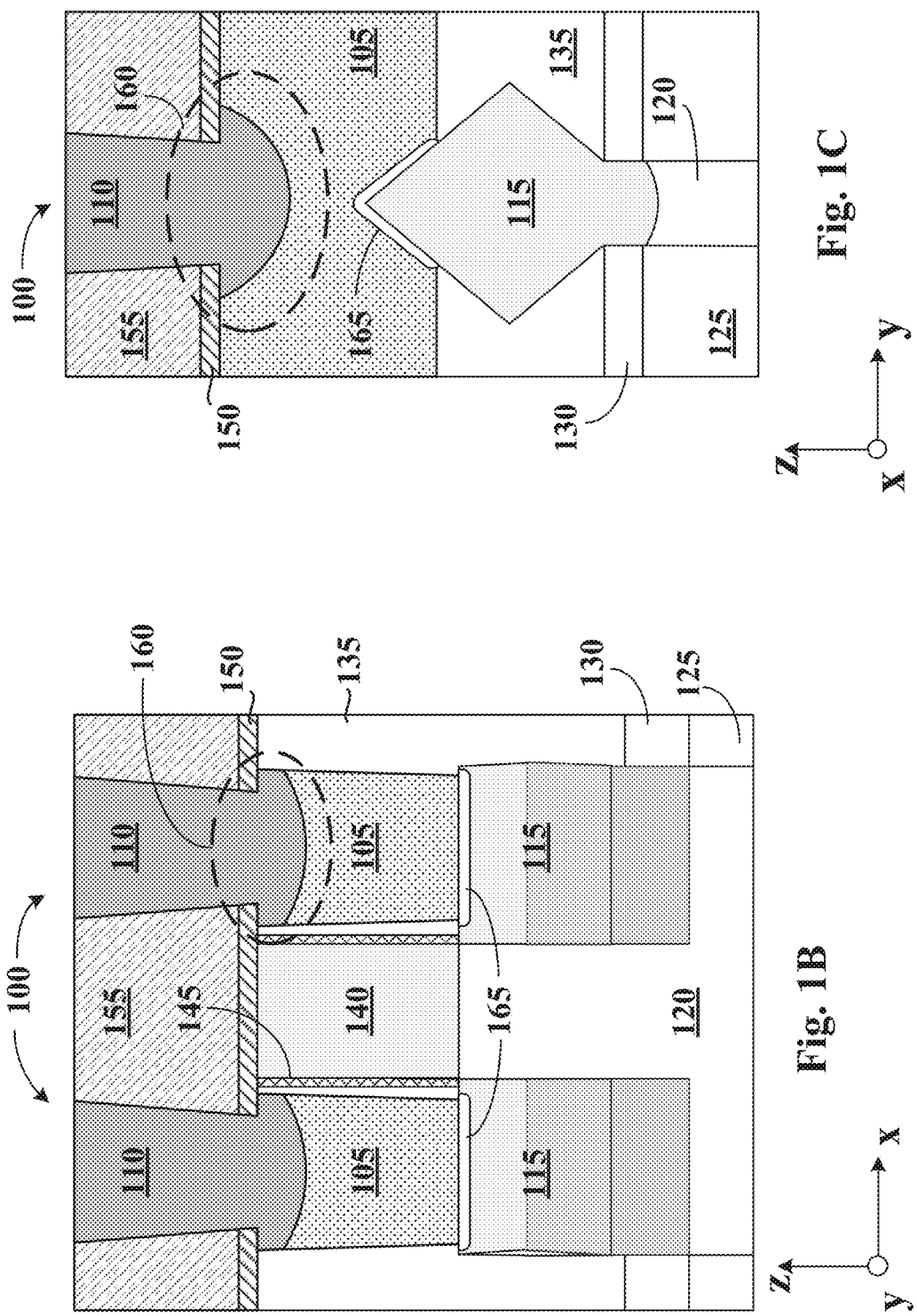

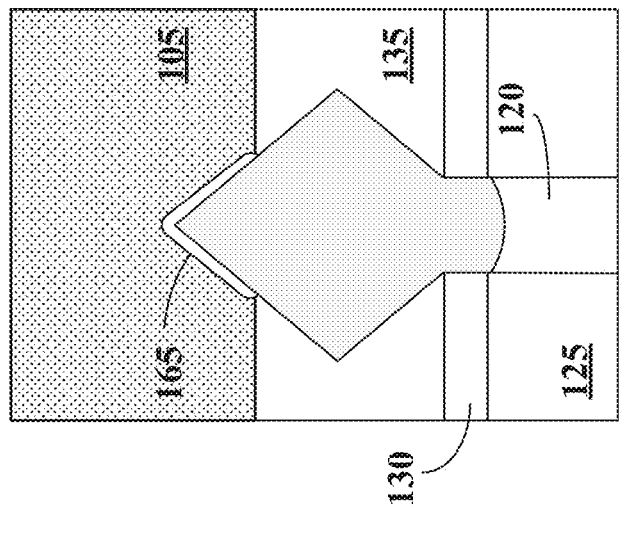
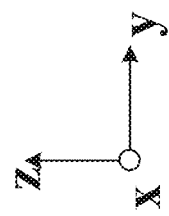
Fig. 3B
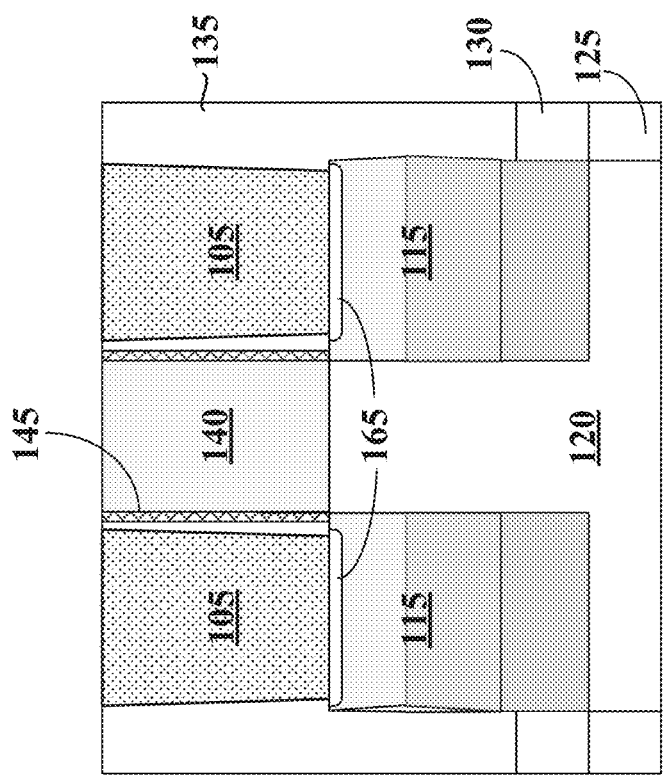
Fig. 3A

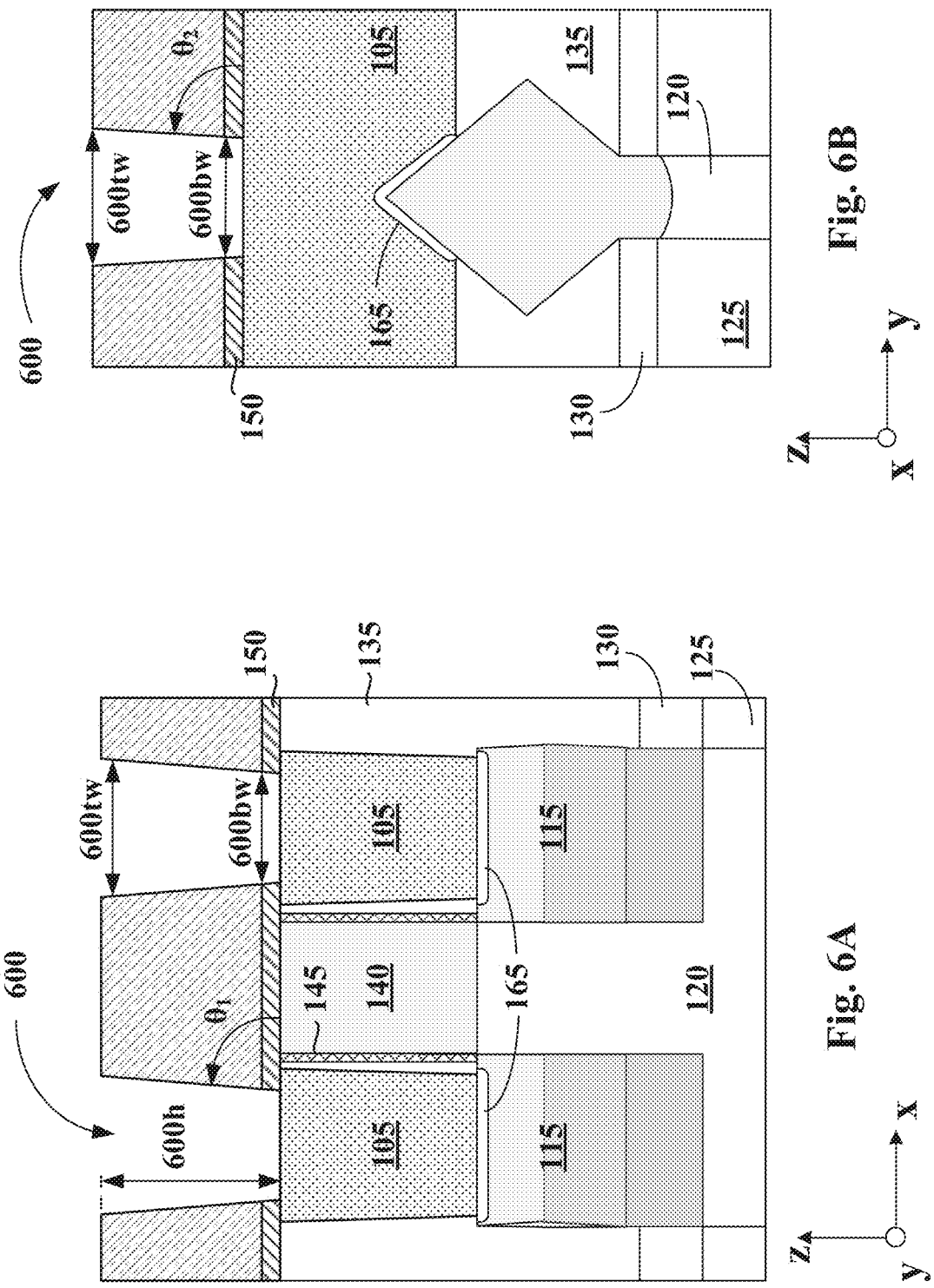

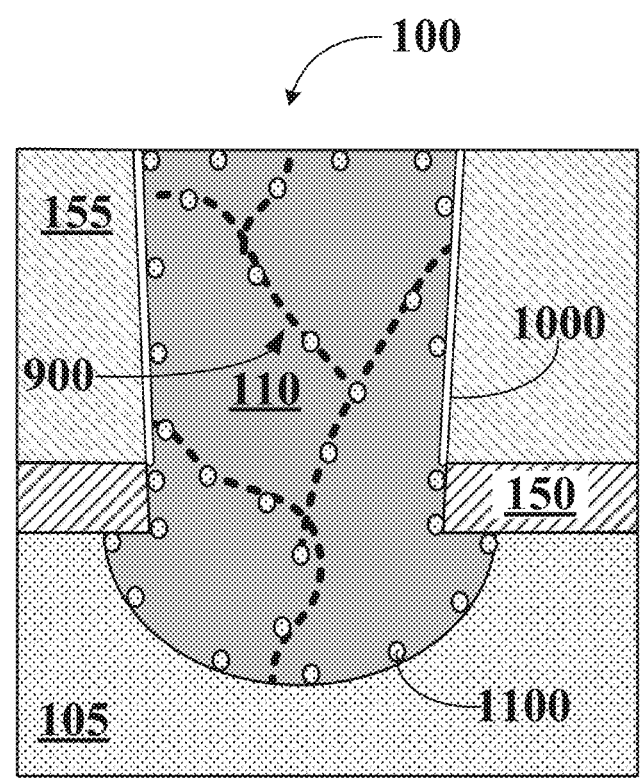
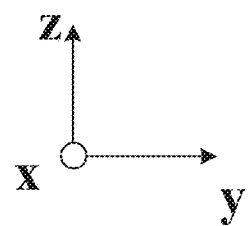
Fig. 11

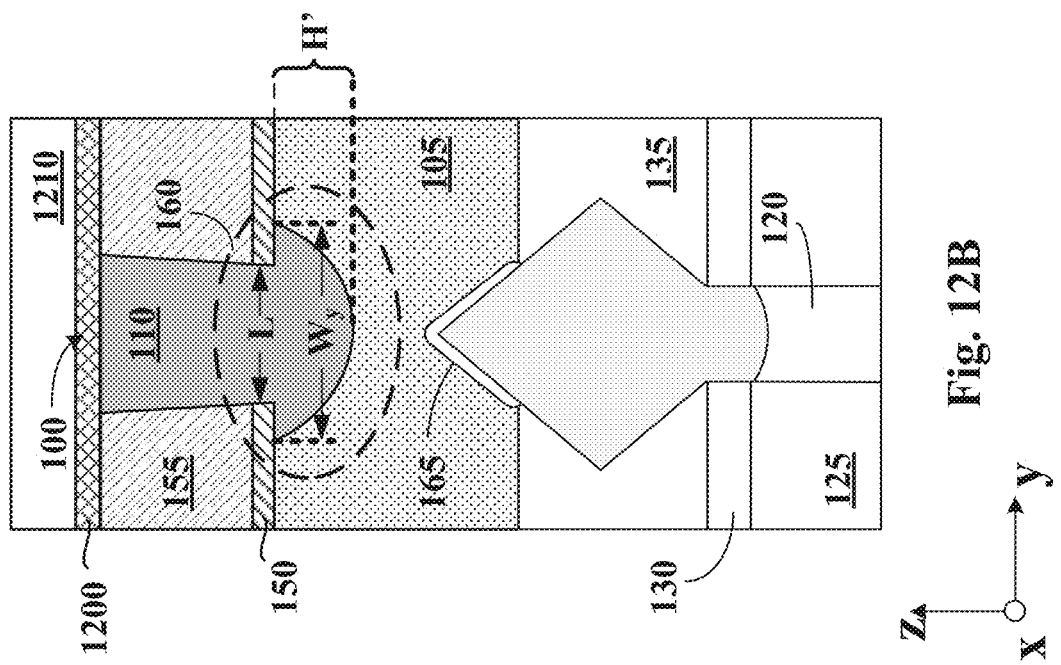
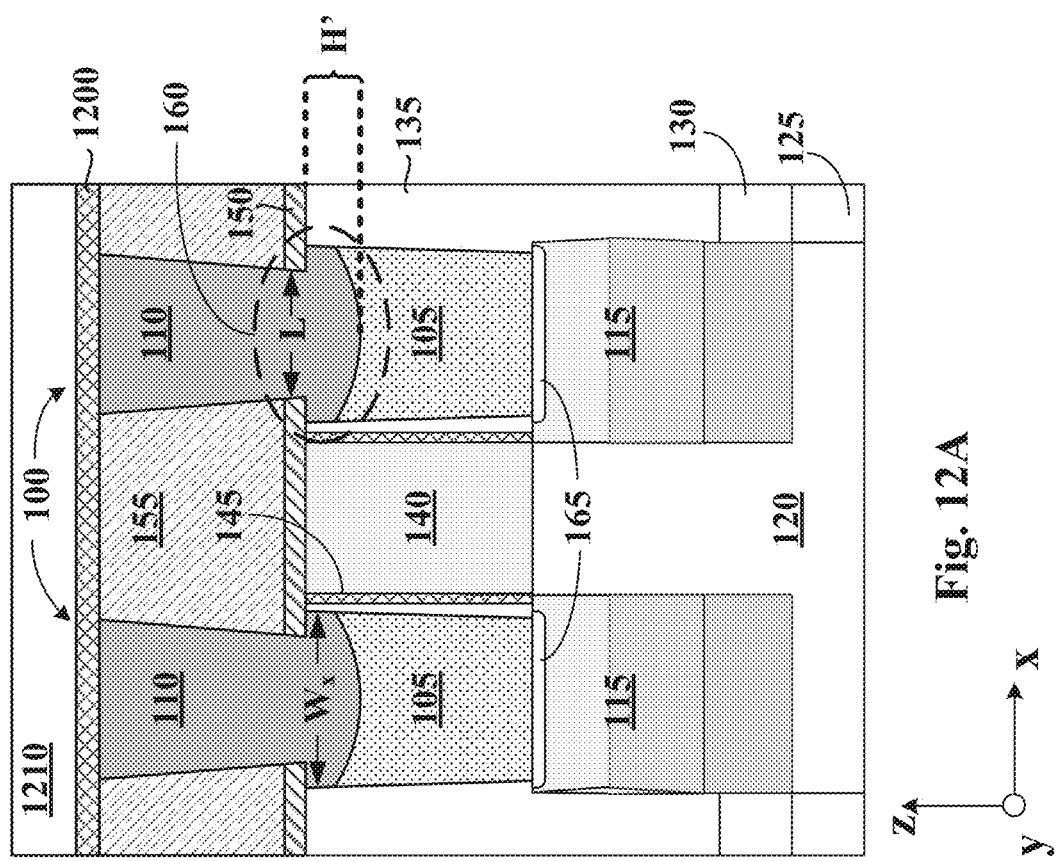
Fig. 12A
Fig. 12B

LINER-FREE CONDUCTIVE STRUCTURES WITH ANCHOR POINTS

CROSS-REFERENCE TO RELATED APPLICATIONS

This application is a continuation of U.S. patent application Ser. No. 17/815,730, titled "Liner-Free Conductive Structures with Anchor Points," filed Jul. 28, 2022, which is a divisional of U.S. patent application Ser. No. 16/936,335, titled "Liner-Free Conductive Structures with Anchor Points," filed Jul. 22, 2020, which claims the benefit of U.S. Provisional Patent Application No. 62/967,278, titled "Liner-free Conductive Structures with Anchor Points," filed Jan. 29, 2020, each of which is incorporated herein by reference in its entirety.

BACKGROUND

In an integrated circuit, conductive structures (e.g., metal contacts, vias, and lines) are electrically coupled to transistor regions, such as the gate electrode and the source/drain regions, and are configured to propagate electrical signals from and to the transistors. The conductive structures, depending on the complexity of the integrated circuit, may form one or more layers of metal wiring.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 1B and 1C are cross-sectional views of barrier-free or liner-free conductive structures formed on cobalt conductive structures, in accordance with some embodiments.

FIGS. 3A/B-7A/B are cross-sectional views of various fabrication operations during the formation of barrier-free or liner-free conductive structures on cobalt conductive structures, in accordance with some embodiments.

FIGS. 9-11 are magnified cross-sectional views of various fabrication operations during the formation of a barrier-free or liner-free conductive structure on a cobalt conductive structure, in accordance with some embodiments.

FIGS. 12A and 12B are cross-sectional views of additional layers formed on barrier-free or liner-free conductive structures formed on cobalt conductive structures, in accordance with some embodiments.

DETAILED DESCRIPTION

Figure 1A:
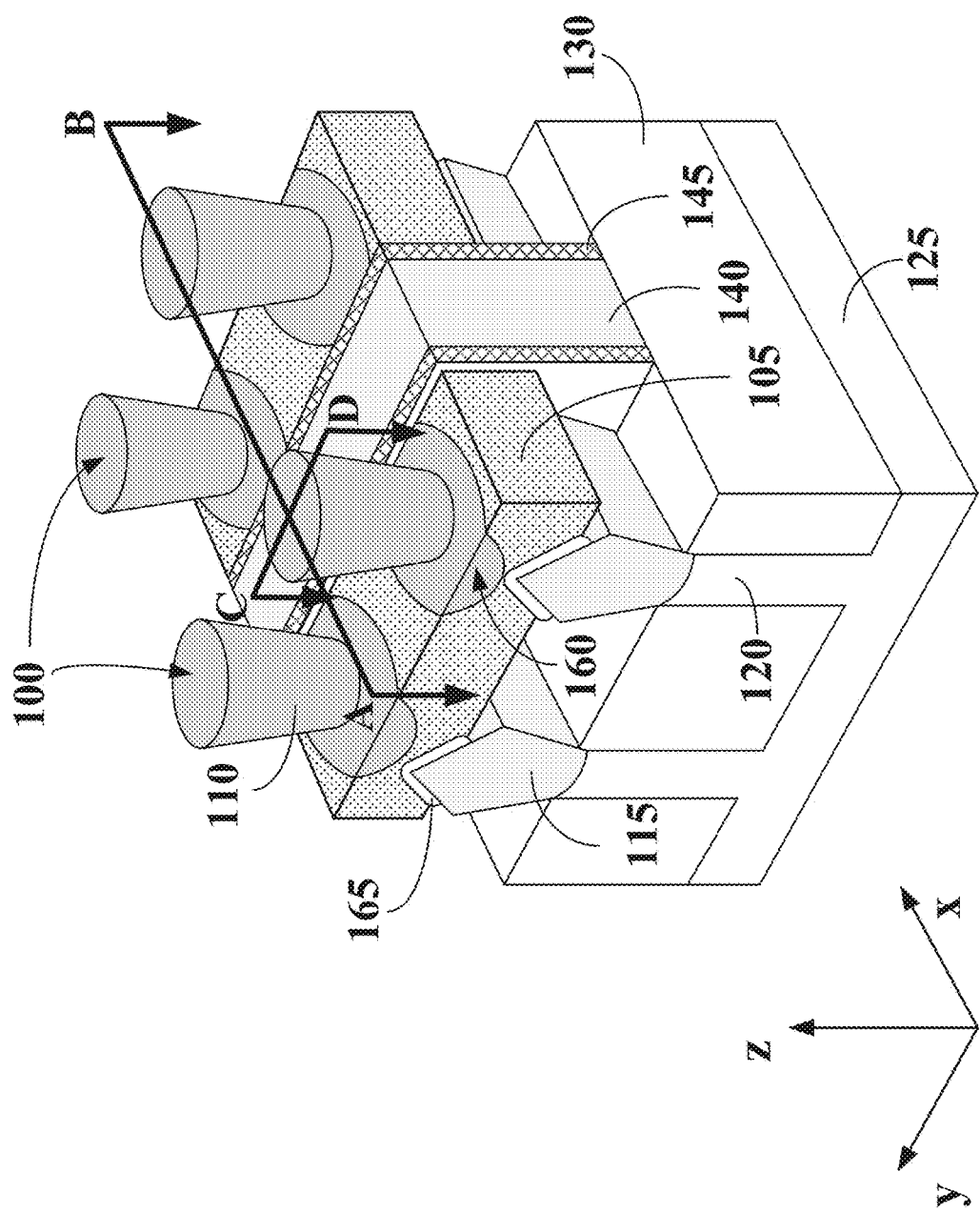
FIG. 1A is an isometric view of a barrier-free or liner-free conductive structures formed on cobalt conductive structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Active and passive devices in an integrated circuit (IC) are interconnected at a local level (e.g., within the same area of the IC) and at a global level (e.g., between different areas of the IC) through a number of conductive structures, such as metal contacts, metal vias and metal lines. The conductive structures are arranged in vertically stacked metallization or interconnect layers. Design considerations are taken into account when metallization layers with different conductive materials are stacked on top of each other to avoid performance degradation due to an undesirable interaction between the conductive materials—for example, diffusion. This is paramount for conductive structures that do not use barrier or liner layers.

Conductive structures without barrier or liner layers (also referred to herein as "liner-free or barrier-free conductive structures") are attractive because they exhibit lower electrical resistance compared to conductive structures with barrier or liner layers. This is because the liner or the barrier layers—which are more resistive than the metal fill layer of the conductive structure—consume space that can be otherwise occupied by the metal fill layer within the conductive structure. Therefore, by eliminating the liner or barrier layers in the conductive structures, the lower resistance metal fill can occupy the entire volume of the conductive structure and further reduce the contact resistance of the conductive structure.

However, since the liner-free or barrier-free conductive structures do not include liner or barrier layers that can act as diffusion barriers, liner-free or barrier-free conductive structures formed on conductive structures filled with a different metal may be unable to prevent or suppress out-diffusion of the underlying metal under certain conditions. For example, ruthenium filled liner-free or barrier-free conductive structures overlying cobalt conductive structures (e.g., cobalt contacts) are unable to prevent or suppress cobalt out-diffusion through the ruthenium metal grain boundaries when both structures are annealed or subjected to thermal cycling. The aforementioned behavior poses limitations to the implementation of ruthenium liner-free or barrier-free conductive structures and makes the ruthenium liner-free or barrier-free conductive structures challenging to integrate with cobalt conductive structures.

To address the aforementioned shortcomings, this disclosure is directed to a method for forming liner-free or barrier-free ruthenium conductive structures that can mitigate the out-diffusion of cobalt atoms from underlying cobalt conductive structures (e.g., cobalt contacts). In some embodiments, the liner-free or barrier-free ruthenium conductive structures are subjected to a low temperature annealing process (e.g., lower than about 360° C.) that allows the ruthenium grains to grow and minimizes cobalt diffusion through the ruthenium metal grain boundaries. In some embodiments, the liner-free or barrier-free ruthenium conductive structures are formed with anchor points located in the cobalt conductive structures to prevent ruthenium metal "pull-out" during a planarization operation.

According to some embodiments, FIG. 1A is a partial isometric view of liner-free or barrier-free conductive structures 100 (liner-free conductive structures 100) filled with ruthenium metal 110 and formed on cobalt conductive structures 105. Cobalt conductive structures 105 are formed on source/drain (S/D) epitaxial structures 115, which are in turn grown on recessed portions of fin structures 120 disposed on substrate 125. Bottom portions of fin structure 120 and S/D epitaxial structures 115 are surrounded by a first dielectric layer 130, which forms an isolation structure (e.g., a shallow trench isolation structure) according to some embodiments.

In addition, FIG. 1A includes a transistor gate structure 140 disposed between cobalt conductive structures 105. Gate structure 140 is electrically isolated from cobalt conductive structures 105 by spacers 145 and a dielectric layer not shown in FIG. 1A. In some embodiments, transistor gate structure 140, fin structures 120, and S/D epitaxial structures 115 form corresponding fin-based transistors. In some embodiments, cobalt conductive structures 105 form S/D contacts for the fin-based transistors shown in FIG. 1A. In some embodiments, cobalt conductive structures 105 have an elongated rectangular shape and may extend to two or more S/D epitaxial structures 105. As a result, one or more liner-free conductive structures 100 can be formed on each cobalt conductive structure 105.

As shown in FIG. 1A, bottom portions of liner-free conductive structures 100 include an "anchor point" 160, which is formed within a top portion of cobalt conductive structures 105. In some embodiments, anchor points 160 have an arcuate or semi-spherically shape to prevent ruthenium metal 110 from being "pulled-out" during a ruthenium planarization process. Anchor points 160 also increase the surface area between ruthenium metal 110 and cobalt conductive structures 105, and reduce the contact resistance between the two structures. In some embodiments, a silicide layer 165 is interposed between cobalt conductive structures 105 and S/D epitaxial structure 115 to provide further contact resistance reduction.

In some embodiments, FIGS. 1B and 1C are partial cross-sectional views of FIG. 1A along cut lines AB and CD. For example, FIG. 1B shows portions of FIG. 1A along the z-x plane (e.g., along fin structure 120) and FIG. 1C shows portions of FIG. 1A along the z-y plane (e.g., along cobalt structure 105). FIGS. 1B and 1C show additional layers not shown in FIG. 1A. For example, these additional layers include etch stop layer 150 and interlayer dielectric (ILD) 155 surrounding top and mid-sections of liner-free conductive structures 100 (e.g., above cobalt conductive structures 105), and second dielectric 135 disposed on first dielectric 130 surrounding upper portions of S/D epitaxial structures 115, and cobalt conductive structures 105.

FIGS. 1B and 1C show details of anchor point 160 at the aforementioned cutting locations. As shown in FIG. 1B, the arcuate or semi-spherically shape of anchor point 160 is restricted by the width of cobalt conductive structures 105. This is because the width of cobalt conductive structures 105 along the x-direction is narrower than the width of anchor point 160. In contrast, in FIG. 1B, the arcuate or semi-spherically shape of anchor point 160 is not restricted by the length of cobalt conductive structures 105. Based on the above, and depending on the cutting direction, the anchor point 160 may appear to have a different shape. For cobalt conductive structures 105 with a width larger than the width of anchor point 160, the shape of anchor point 160 would appear similar to that shown in FIG. 1C for any cutting direction.

The structures shown in FIGS. 1A, 1B, and 1C are exemplary and variations of these structures are within the spirit and the scope of this disclosure. For example, the shape of cobalt conductive structures 105 and the shape of S/D epitaxial structure 115 can be different from that shown in FIGS. 1A, 1B, and 1C. In some embodiments, conductive structures 105 are shorter, longer, wider, or narrower from those shown in FIGS. 1A, 1B, and 1C. Conductive structures 105 can be circular contacts, oval-shaped contacts, rectangular shaped contacts, or combinations thereof. In some embodiments, multiple liner-free conductive structures 100 can be formed on a cobalt conductive structure 105. In some embodiments, some or all liner-free conductive structures 100 are missing an anchor point 160. In some embodiments, liner-free conductive structures can extend over gate contacts not shown in FIGS. 1A, 1B, and 1C. S/D epitaxial structure 115 can have additional facets. In some embodiments, S/D epitaxial structure 115 from adjacent fin structures 120 merge to form merged S/D epitaxial structures on which a cobalt conductive structure 105 and one or more liner-free conductive structures 100 can be formed. Further, some layers or structures are not illustrated in FIGS. 1A, 1B, and 1C for clarity and easy of description. For example, a gate dielectric stack, work function layers, barrier layers, and metal fill for gate structure 140 are not shown. In addition, barrier layers for cobalt conductive structures 105 and spacers on bottom sidewall surfaces of S/D epitaxial structures 115 above first dielectric layer 130 are not shown. The aforementioned layers and structures not shown in FIGS. 1A, 1B, and 1C are within the spirit and the scope of this disclosure.

In some embodiments, liner-free conductive structures 100 are formed directly on cobalt conductive structures 105 without intervening layers. For example, there are no barrier layers, liner layers, or adhesion layers between ruthenium metal 110 in liner-free conductive structures 100 and cobalt conductive structures 105. By way of example and not limitation, liner-free conductive structures 100 form a network of vias that electrically connect cobalt structures 105 to upper metallization levels (e.g., to copper metallization levels) not shown in FIGS. 1A, 1B, and 1C. According to some embodiments, liner-free conductive structures 100 are formed with a method that mitigates cobalt out-diffusion towards the upper metallization levels through liner-free conductive structures 100. Cobalt out-diffusion can form voids in cobalt conductive structures 105, which are detrimental for the contact resistance. For example, voids within conductive structures 105 can increase contact resistance by about 15%. Excessive cobalt out-diffusion can result in electrical opens within cobalt conductive structures 105.

Figure 2A:
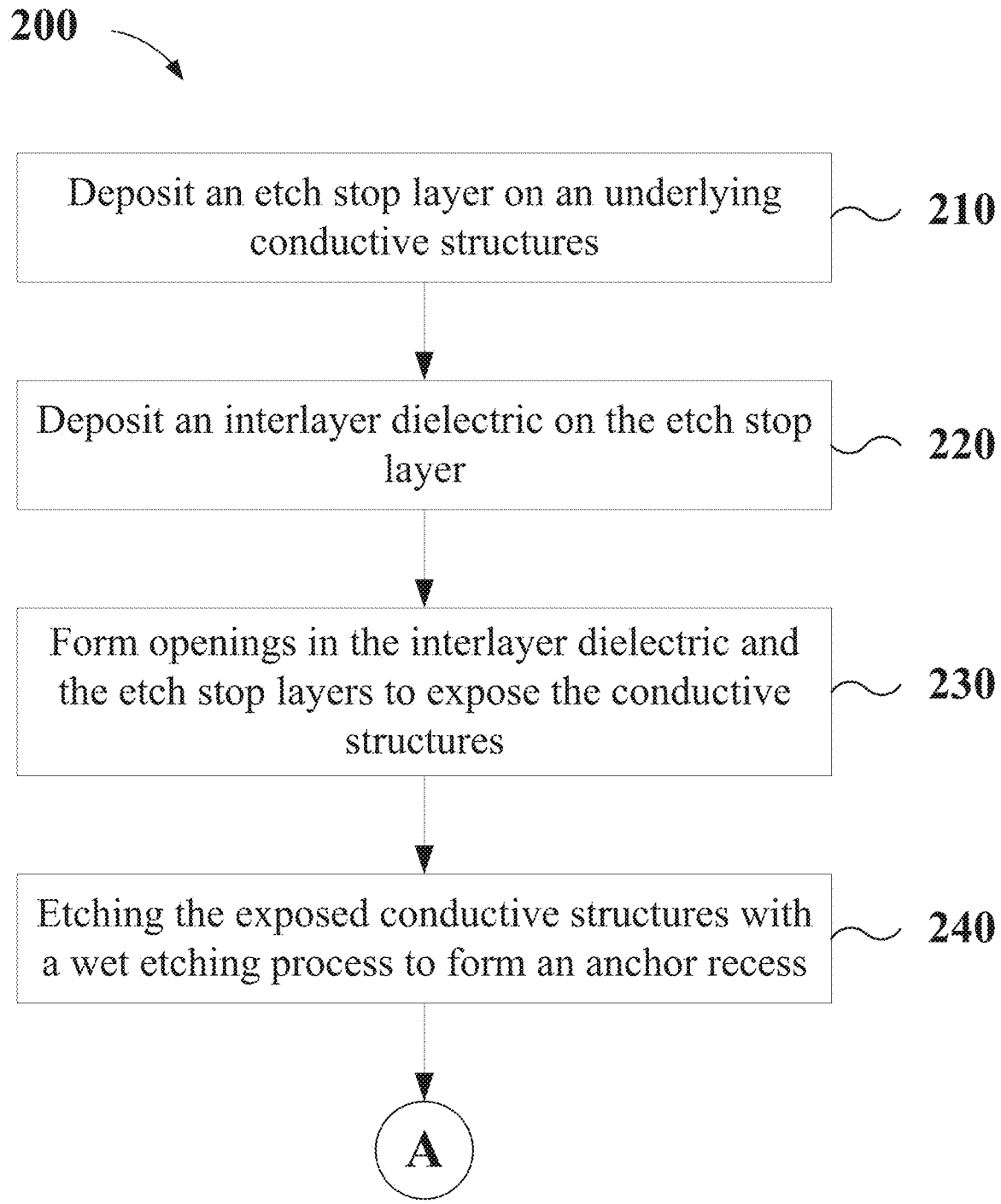
FIGS. 2A and 2B are flowcharts of a method describing the formation of barrier-free or liner-free conductive structures, in accordance with some embodiments.
Figure 2B:
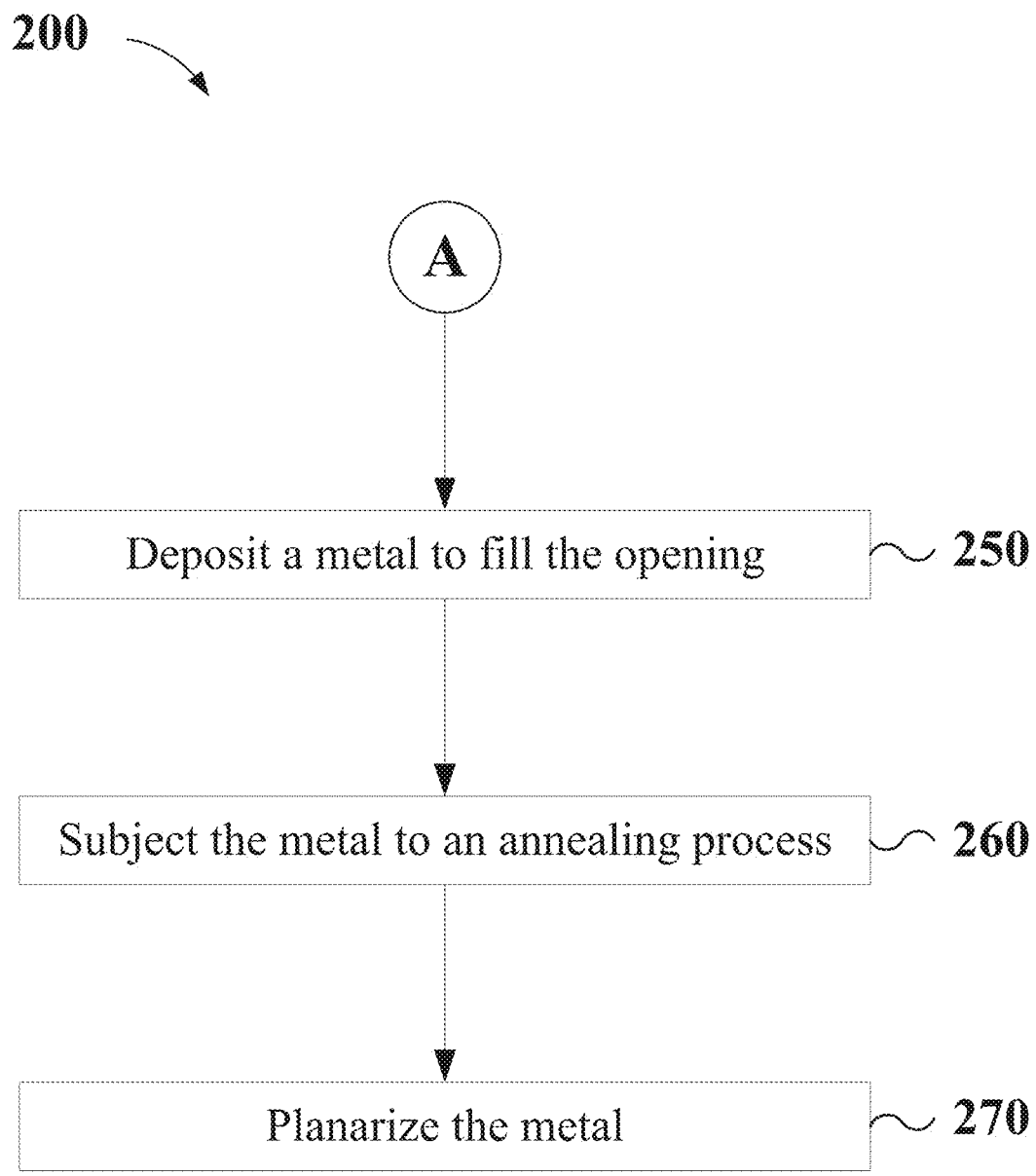

In some embodiments, FIGS. 2A and 2B are flowcharts of a fabrication method 200 for the formation of liner-free conductive structures 100 shown in FIGS. 1A, 1B, and 1C. Other fabrication operations may be performed between the various operations of method 200 and may be omitted merely for clarity and ease of description. These various operations are within the spirit and the scope of this disclosure. Additionally, not all operations may be required to perform the disclosure provided herein. Some of the operations may be performed simultaneously, or in a different order than the ones shown in FIGS. 2A and 2B. In some embodiments, one or more other operations may be performed in addition to or in place of the presently described operations. Method 200 will be described in reference to FIGS. 3A/B-12A/B—where FIGS. 3A-12A, like FIGS. 1B and 1C, are cross-sectional views along cut lines AB and CD shown in FIG. 1A.

In some embodiments, FIGS. 3A and 3B are intermediate structures for method 200. In FIGS. 3A and 3B, fin structure 120, source/drain epitaxial structures 115, first dielectric layer 130, second dielectric layer 135, gate structure 140, spacers 145, silicide layer 165, and cobalt conductive structures 105 have been previously formed in operations not shown in method 200. In some embodiments, FIGS. 3A and 3B show the structure of FIGS. 1A and 1B after the formation of cobalt conductive structures 105 on silicide layer 165 over source/drain epitaxial structures 115. At the fabrication stage shown in FIGS. 3A and 3B, the top surface of cobalt conductive structures 105 is substantially coplanar with the top surface of second dielectric layer 135. This can be achieved, for example, with a planarization process after the deposition of cobalt metal.

Figure 4B:
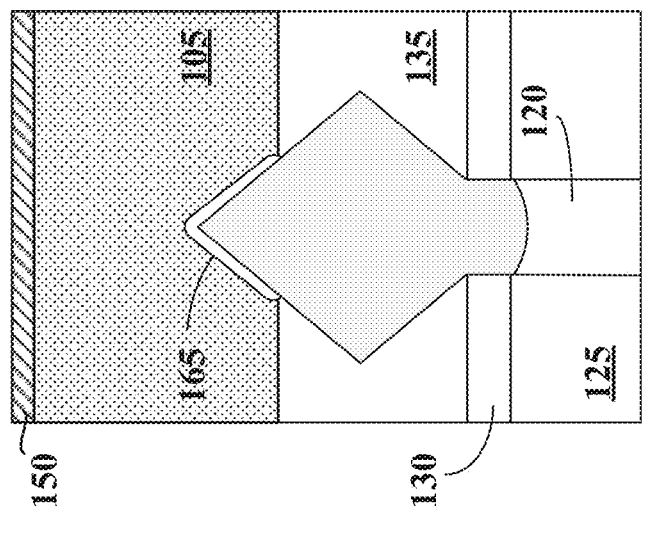
Figure 4A:
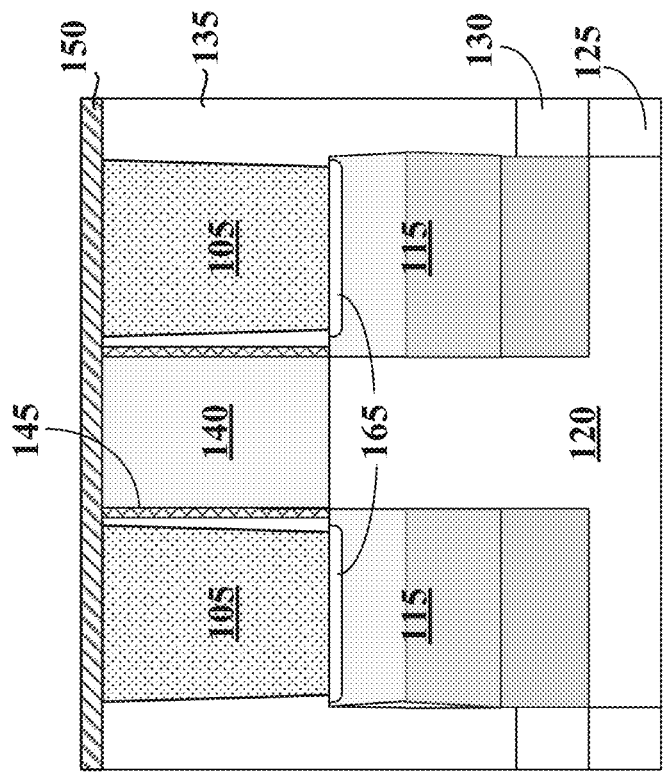

In referring to FIG. 2A, method 200 begins with operation 210 and the process of depositing an etch stop layer (e.g., like etch stop layer 150 shown in FIGS. 1C and 1D) on an underlying conductive structure (e.g., cobalt conductive structures 105). By way of example and not limitation, etch stop layer 150 can be blanket deposited to cover the top surface of cobalt conductive structures 105 and second dielectric layer 135 as shown in FIGS. 4A and 4B. In some embodiments, etch stop layer 150 facilitates the formation of liner-free conductive structures 100. By way of example and not limitation etch stop layer 150 can include silicon nitride ($Si_3N_4$), silicon oxynitride (SiON), silicon carbide (SiC), silicon carbo-nitride (SiCN), or any combination thereof. Further, etch stop layer 150 may be deposited by low pressure chemical vapor deposition (LPCVD), plasma enhanced chemical vapor deposition (PECVD), chemical vapor deposition (CVD), atomic layer deposition (ALD), or any other suitable deposition process at a thickness between about 1 nm and about 3 nm.

Figure 5B:
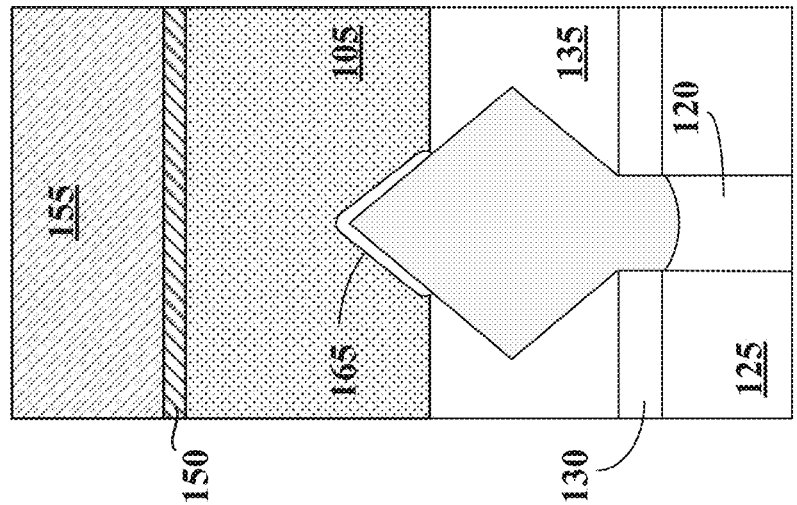
Figure 5A:
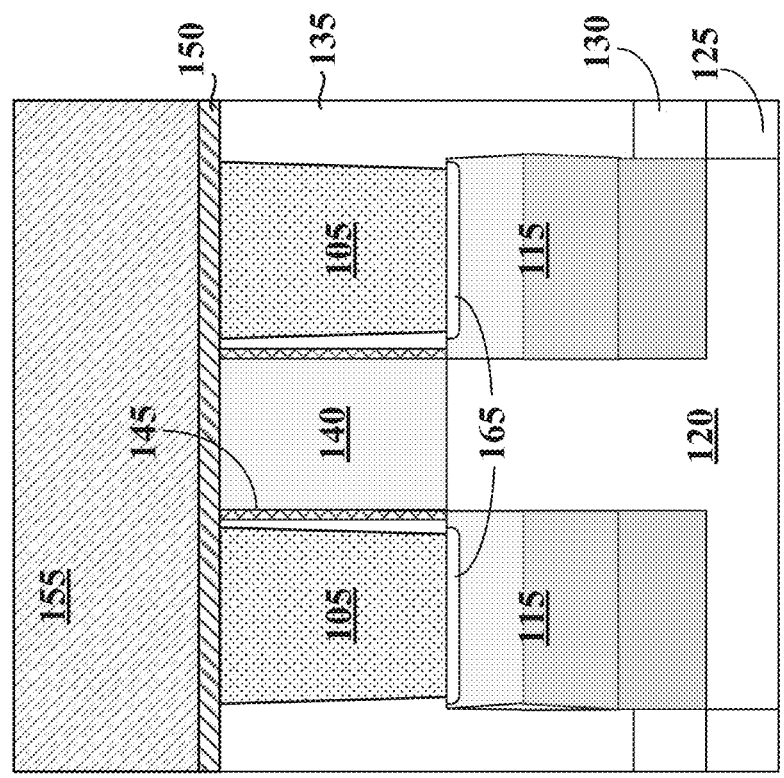

In referring to FIG. 2A, method 200 continues with operation 220 and the process of depositing ILD 155 on etch stop layer 150 as shown in FIGS. 5A and 5B. By way of example and not limitation, ILD 155 can include a low-k dielectric material with a dielectric constant lower than about 3.9, such as a carbon-containing silicon oxide layer. In some embodiments, ILD 155 contains hydrogen and/or nitrogen. By way of example, ILD 155 can be deposited with a CVD process, a plasma-enhanced CVD (PECVD) process, or any other suitable deposition method. By way of example and not limitation, ILD 155 is deposited at a thickness between about 50 nm and nm depending on the desired aspect ratio of liner-free conductive structures 100.

In referring to FIG. 2A, method 200 continues with operation 230 and the process of forming openings in ILD 155 and etch stop layer 150 to expose cobalt conductive structures 105. In some embodiments, openings can be formed concurrently to expose top portions of cobalt conductive structures 105. By way of example and not limitation, FIGS. 6A and 6B show the structures of FIGS. 5A and 5B after the formation of openings 600 according to operation 230. In some embodiments, openings 600 are formed with photolithography and etching operations. For example, a photoresist layer can be deposited on ILD 155 and subsequently patterned to form an etch mask. A dry etching process etches portions of ILD 155 and etch stop layer 150 not covered by the photoresist etch mask to form openings 600 shown in FIGS. 6A and 6B.

Since ILD 155 and etch stop layer 150 include different materials, a dry etching chemistry with different etching selectivity for each etched layer can be used. In some embodiments, the dry etching process can include two or more sub-operations with each sub-operation using a different etchant based on etched material (e.g., ILD 155 or etch stop layer 150). For example, a first sub-operation etches ILD 155 and terminates on etch stop layer 140. A second sub-operation etches etch stop layer 150 and terminates on cobalt conductive structure 105. Additional sub-operations can be used to over-etch cobalt conductive structure 105 and/or to remove a polymer material formed during the etching operations.

In referring to FIGS. 6A and 6B, openings 600 have a sidewall angle $\theta_1$ along the x-axis and a sidewall angle $\theta_2$ along the y-axis. Sidewall angles $\theta_1$ and $\theta_2$ can be modulated via the etching process conditions. Sidewall angles $\theta_1$ and $\theta_2$, which can be tuned independently, are formed between the sidewall surfaces of opening 600 and the horizontal x-y plane. Further, each of angles $\theta_1$ and $\theta_2$ can range between about 85° and about 90°. In some embodiments, sidewall angles $\theta_1$ and $\theta_2$ are substantially equal. In some embodiments, top width 600$tw$ of openings 600 (e.g., in the x- or y-direction) can be substantially equal to or larger than bottom width 600$bw$ (e.g., along the x- or y-direction, respectively). In some embodiments, the aspect ratio of openings 600 (e.g., the ratio of height 600$h$ to a top width 600$tw$) can range between about 3 and about 4. However, this is not limiting and aspect ratios less than about 3 or greater than about 4 are within the spirit and the scope of this disclosure.

Figure 7B:
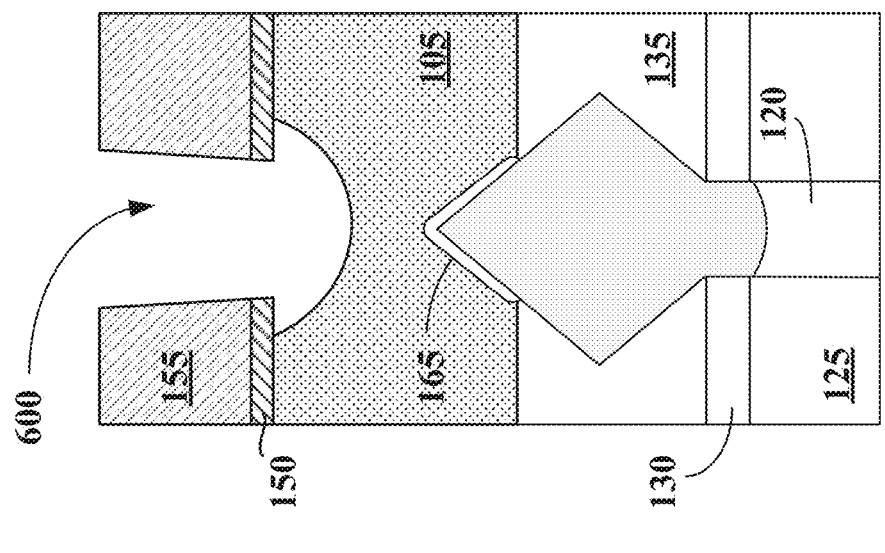
Figure 7A:
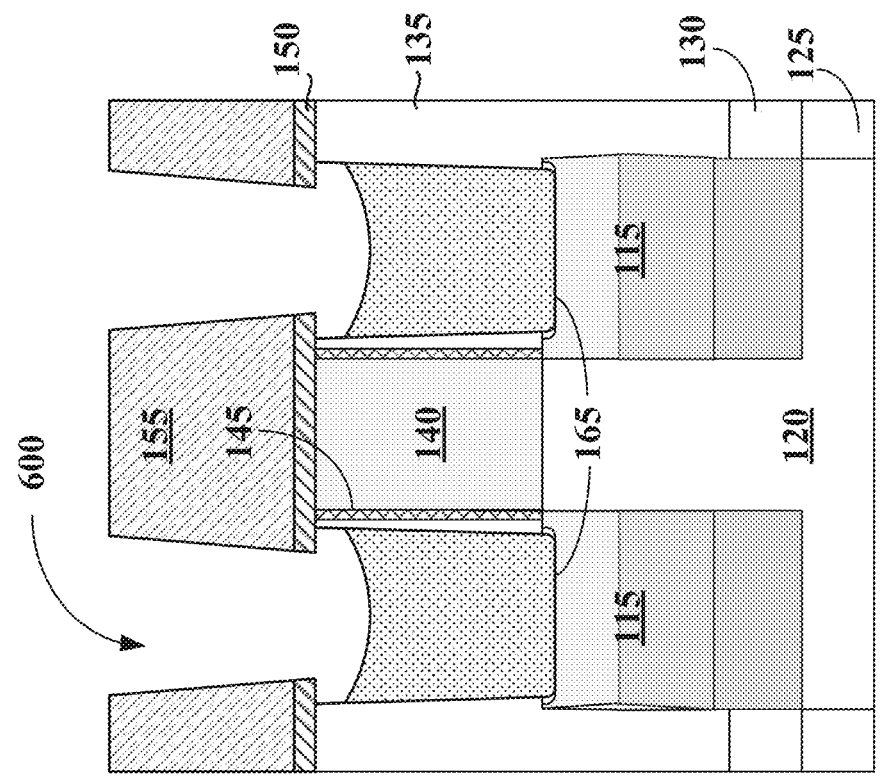

In referring to FIG. 2A, method 200 continues with operation 240 and the process of etching the exposed cobalt conductive structures 105 with a wet etching process to form an anchor recess (e.g., in each conductive structure 105). By way of example and not limitation, FIGS. 7A and 7B show the structures of FIGS. 6A and 6B after the wet etching process according to operation 240. In some embodiments, the etching chemistry includes an aqueous solution of butoxyethanol ($C_6H_{14}O_2$), hydroxylamine ($H_3NO$), and diethylenetriaminepentaacetic acid ($C_{14}H_{23}N_3O_{10}$), in which the main etchant is water and $C_6H_{14}O_2$, $H_3NO$, and $C_{14}H_{23}N_3O_{10}$ functions as cobalt surface protectants. The wet etching chemistry, which is selective to cobalt, isotropically etches the exposed cobalt metal in all directions. As a result, an arcuate or semi-spherical anchor recess is formed on a top portion of cobalt conductive structure 105 as shown in FIGS. 7A and 7B.

As discussed above with respect to FIGS. 1A, 1B, and 1C, the anchor recess is restricted by the width of cobalt conductive structures 105 in the x-direction as shown FIG. 7A. If the width of cobalt conductive structures 105 is equal to or larger than the width of the anchor recess, the anchor recess in cobalt conductive structures 105 would look the same between FIGS. 7A and 7B.

Figure 8A:
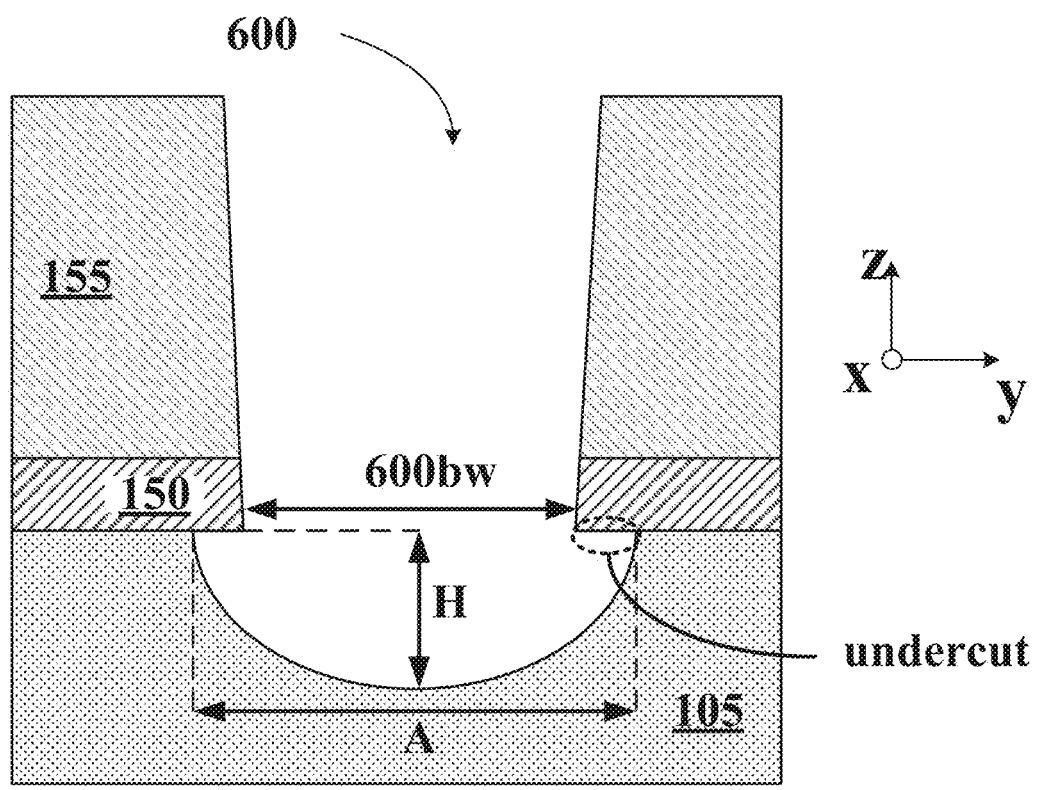
FIG. 8A is a magnified cross-sectional view of a contact opening on a cobalt conductive structure, in accordance with some embodiments.

In some embodiments, the exposure of cobalt conductive structures 105 to the wet etching chemistry is timed to control the size of the semi-spherical or arcuate shaped anchor recess. For example, the exposure time can range from about 50 s to about 100 s or more depending on the etch rate at which cobalt metal is being consumed by the etching chemistry. FIG. 8A is a magnified view of the semi-spherical or arcuate shaped anchor recess shown in FIG. 7B. In some embodiments, the semi-spherical or arcuate shaped anchor recess has a width A along the y-direction that ranges from about 21 nm to about 39 nm. In some embodiments, the semi-spherical or arcuate shaped anchor recess has a height H between about 7 nm and about 13 nm. In some embodiments, a ratio A/H is about 3. The aforementioned ranges are not limiting and larger or smaller recess sizes are within the spirit and the scope of this invention. In some embodiments, a large anchor recess can be harder to fill while a smaller anchor recess may not prevent metal pull-out during a planarization process. According to some embodiments, width A of the semi-spherical or arcuate shaped anchor recess is larger than bottom width 600bw of opening 600 (e.g., A>600bw), which ranges from about 13 nm to about 15 nm. In some embodiments, a ratio A/600bw ranges from about 1.7 to about 2.6, and a ratio 600bw/H ranges from about 1 to about 2. Consequently, an undercut having a width along the y-direction of about (A−600bw)/2 is formed on each side of the anchor recess below etch stop layer 150. In some embodiments, the undercut ranges from about 4 nm to about 12 nm.

Figure 8B:
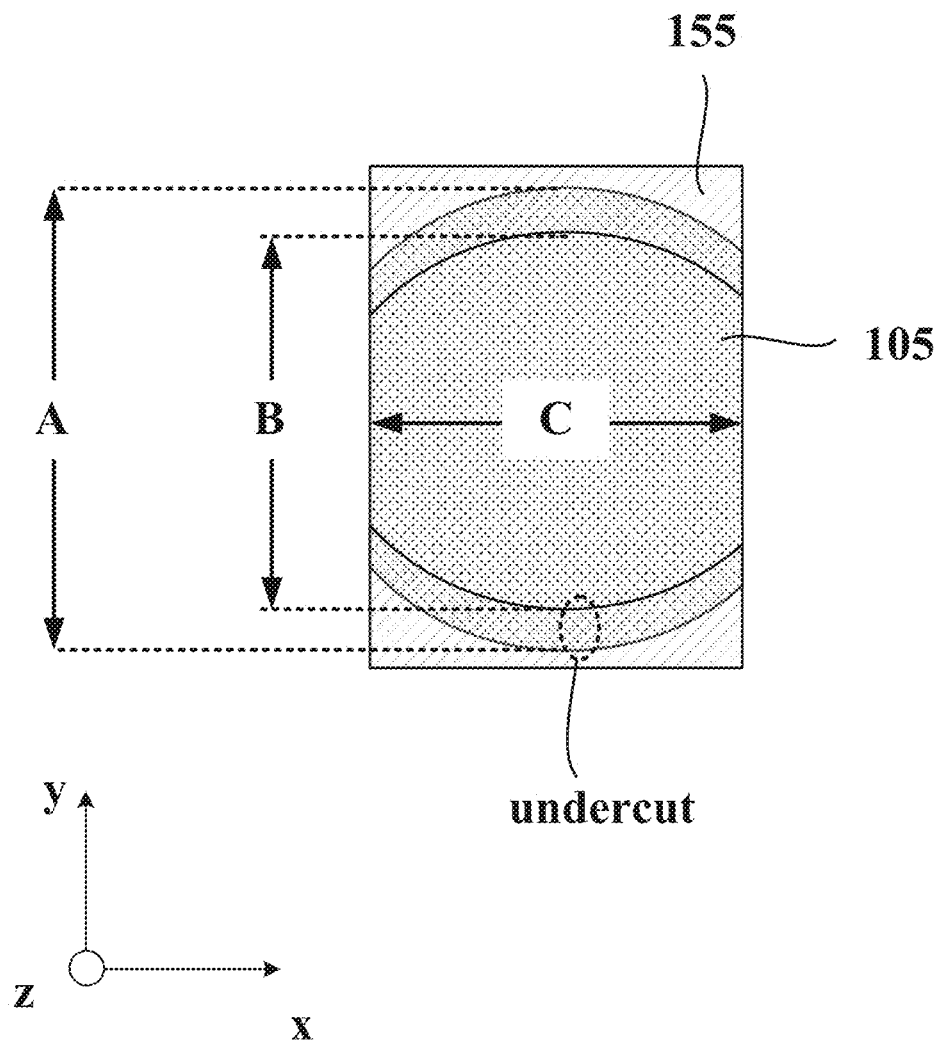
FIG. 8B, is a magnified top view of a contact opening on a cobalt conductive structure, in accordance with some embodiments.

As discussed above, the width of the semi-spherical or arcuate shaped anchor recess along the x-direction shown in FIG. 7A is different from width A along the y-direction due to the smaller width of cobalt structures 105 along the x-direction. This is also illustrated in FIG. 8B, which is a top-view of the anchor recess through opening 600. In FIG. 8B, width C of the anchor recess along the x-direction is restricted by the physical width of cobalt conductive structure 105; therefore, width C along the x-direction is formed smaller than width A of the anchor recess along the y-direction. In other words, the anchor recess appears to have a semi-spherical or arcuate shape when viewed along the y-direction as shown in FIG. 7B and a "trimmed" semi-spherical or arcuate shape when viewed along the x-direction as shown in FIG. 7A.

According to some embodiments, the anchor recess serves two purposes: (1) offers an anchor point for metal fill 110 to prevent pull-out of the metal fill in opening 600 during a subsequent planarization process, and (2) increases the contact area between the underlying cobalt conductive structure and the metal fill to improve the overall contact resistance.

In referring to FIG. 2B, method 200 continues with operation 250 and the process of depositing a metal to fill openings 600. In some embodiments, the metal in operation 250 is directly deposited on cobalt structure 105 without the formation of liner or barrier layers. In some embodiments, and prior to the metal deposition, a pre-clean is performed to remove native oxide layers (e.g., cobalt oxide) formed on exposed surfaces of cobalt conductive structures 105 and to prepare the surfaces of opening 600 for the metal deposition. In some embodiments, the pre-clean includes an argon (Ar) plasma treatment, a hydrogen ($H_2$) plasma treatment, or combinations thereof. In some embodiments, the hydrogen pre-clean treatment is performed at a temperature equal to or higher than that of the Ar pre-clean treatment. In some embodiments, a bias is applied to the substrate during each treatment with the bias during the Ar pre-clean treatment being greater than that of the $H_2$ plasma pre-clean treatment.

In some embodiments, the ruthenium metal in operation 250 is deposited with a thermal CVD process at a temperature below about 200° C. (e.g., about 180° C.) using a ruthenium carbonyl precursor chemistry, such as triruthenium dodecacarbonyl ($Ru_3(CO)_{12}$). By way of example and not limitation, the ruthenium metal is deposited at a thickness of about 20 nm or at thickness sufficient to fill openings 600, including the anchor recess. In some embodiments, the growth of the ruthenium metal proceeds in a bottom-up manner. For example, ruthenium nucleation first occurs on exposed surfaces of cobalt conductive structure 105 and proceeds vertically along the z-direction until opening 600 is substantially filled. In some embodiments, a deposition temperature below 200° C. promotes the bottom-up growth of the ruthenium metal.

Figure 9:
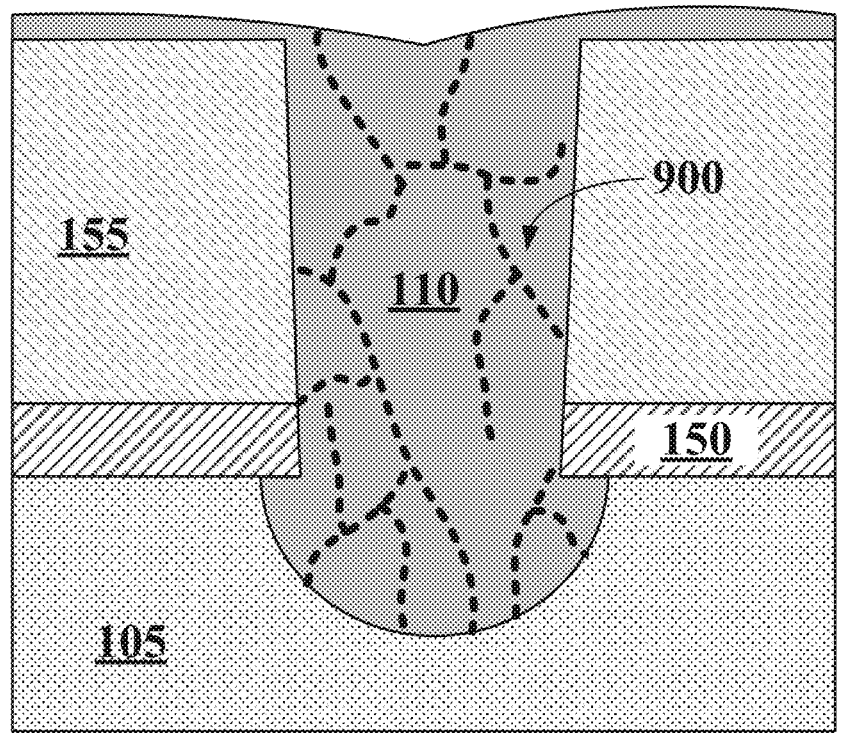

According to some embodiments, FIG. 9 is a magnified view of FIG. 8A after operation 250 and the deposition of ruthenium metal 110 in opening 600. In some embodiments, the as-deposited ruthenium metal 110 extends over ILD 155 outside opening 600 and forms an "overburden" which is removed with a planarization process, such as a chemical mechanical planarization (CMP) process. In some embodiments, the thickness of the overburden is less than about 20 nm due to the bottom-up growth process and the low deposition rate of ruthenium metal 110 on ILD 155.

In some embodiments, the as-deposited ruthenium metal 110 is polycrystalline with small grains, which collectively form a large number of grain boundaries represented by dashed lines 900 in FIG. 9. In some embodiments, the large number of grain boundaries is attributed to the low deposition temperature (e.g., below about 200° C.) of ruthenium metal 110. A large number of grain boundaries in not desirable because they increase the resistivity of ruthenium metal 110. For example, the grain boundaries act as scattering centers for electrons when current flows through the contact. Higher deposition temperatures (e.g., above about 200° C.) can result in fewer grain boundaries but do not promote the bottom-up growth of ruthenium metal 110 described above. Therefore, higher deposition temperatures (e.g., above about 200° C.) can result in an incomplete fill with seams or voids, which can also increase the contact resistance and become a source of defects.

In referring to FIG. 2B, method 200 continues with operation 260 and the process of subjecting ruthenium metal 110 to an annealing process. In some embodiments, the annealing process serves two purposes: (1) promotes the growth of the ruthenium grains and (2) encourages the formation of a ruthenium oxide interfacial layer between ruthenium metal 110 and ILD 155. A side effect of an annealing process with long annealing times and/or high thermal budgets is cobalt out-diffusion from cobalt conductive structures 105, which is discussed below.

Grain growth is desirable because ruthenium metal with larger grains has a lower electrical resistance compared to ruthenium metal with smaller grains. This is because a metal with large grains has fewer grain boundaries (e.g., locations for electron scattering) compared to a metal with small grains.

The ruthenium oxide growth is desirable because it promotes adhesion between ruthenium metal 110 and ILD 155. Therefore, ruthenium is less likely to be "pulled-out" during a subsequent planarization operation. For example, in situations where the anchor point is not formed to prevent ruthenium pull-out, the presence of a ruthenium oxide layer can provide additional adhesion.

In some embodiments, the annealing process is performed at a temperature range between about 200° C. and about 360° C. to mitigate cobalt out-diffusion from the underlying cobalt conductive structures 105. In some embodiments, low annealing temperatures (e.g., closer to about 200° C.) are combined with long annealing times between about 5 min and about 10 min. Conversely, high annealing temperatures (e.g., closer to about 360° C.) are combined with short annealing times between about 1 min and about 5 min. In some embodiments, the annealing ambient includes nitrogen ($N_2$), argon (Ar), helium (He), hydrogen ($H_2$), a forming gas (e.g., a mixture of hydrogen and nitrogen), or any combinations thereof. Oxygen or oxidizing gases are not desirable because the ruthenium metal will convert to ruthenium oxide, which has a higher electrical resistivity than ruthenium metal. In some embodiments, the annealing process is performed at a process pressure between about 2 Torr and about 20 Torr. Higher or lower annealing pressure values are possible and within the spirit and the scope of this disclosure. According to some embodiments, the annealing temperature and the annealing time are critical process parameters to control the ruthenium grain size and the cobalt out-diffusion as discussed below.

Cobalt out-diffusion is not desirable because it creates voids in cobalt conductive structure 105 and increases the resistance of the cobalt conductive structures. Further, cobalt out-diffusion increases the resistivity of the liner-free conductive structures because cobalt metal is more resistive than ruthenium metal. The main mechanism behind the cobalt out-diffusion is thermally driven diffusion described by Fick's law. Therefore, the annealing temperature (e.g., the thermal budget) can be the primary contributor to the cobalt out-diffusion process. Cobalt diffusion occurs through the grain boundaries of ruthenium metal 110. Therefore, fewer grain boundaries can result in fewer diffusion paths for cobalt atoms. One diffused, the cobalt atoms can keep moving towards the top surface of ruthenium metal 110 and agglomerate to form cobalt nodules. If not suppressed, the cobalt nodules can electrically short adjacent conductive structures. As discussed above, cobalt out-diffusion is also undesirable because it results in voids and contact resistance degradation.

In some embodiments, annealing temperatures below about 200° C. can retard cobalt out-diffusion at the expense of the ruthenium grain growth. This means that there is temperature threshold, above which ruthenium grain growth occurs and a measurable resistance benefit is obtained. Conversely, annealing temperatures above about 360° C. are sufficient to promote ruthenium grain growth but can substantially enhance the cobalt out-diffusion through the ruthenium grain boundaries. For example, annealing temperatures that exceed about 360° C. (e.g., 380° C., 400° C., or higher) can cause large voids in cobalt conductive structure 105 due to an accelerated cobalt out-diffusion process. For example, the voids in cobalt conductive structure 105 caused by cobalt out-diffusion can have a length and a width of about 55 nm and a height of about 26 nm. Therefore, annealing temperatures above about 360° C. should be avoided when possible.

Figure 13:
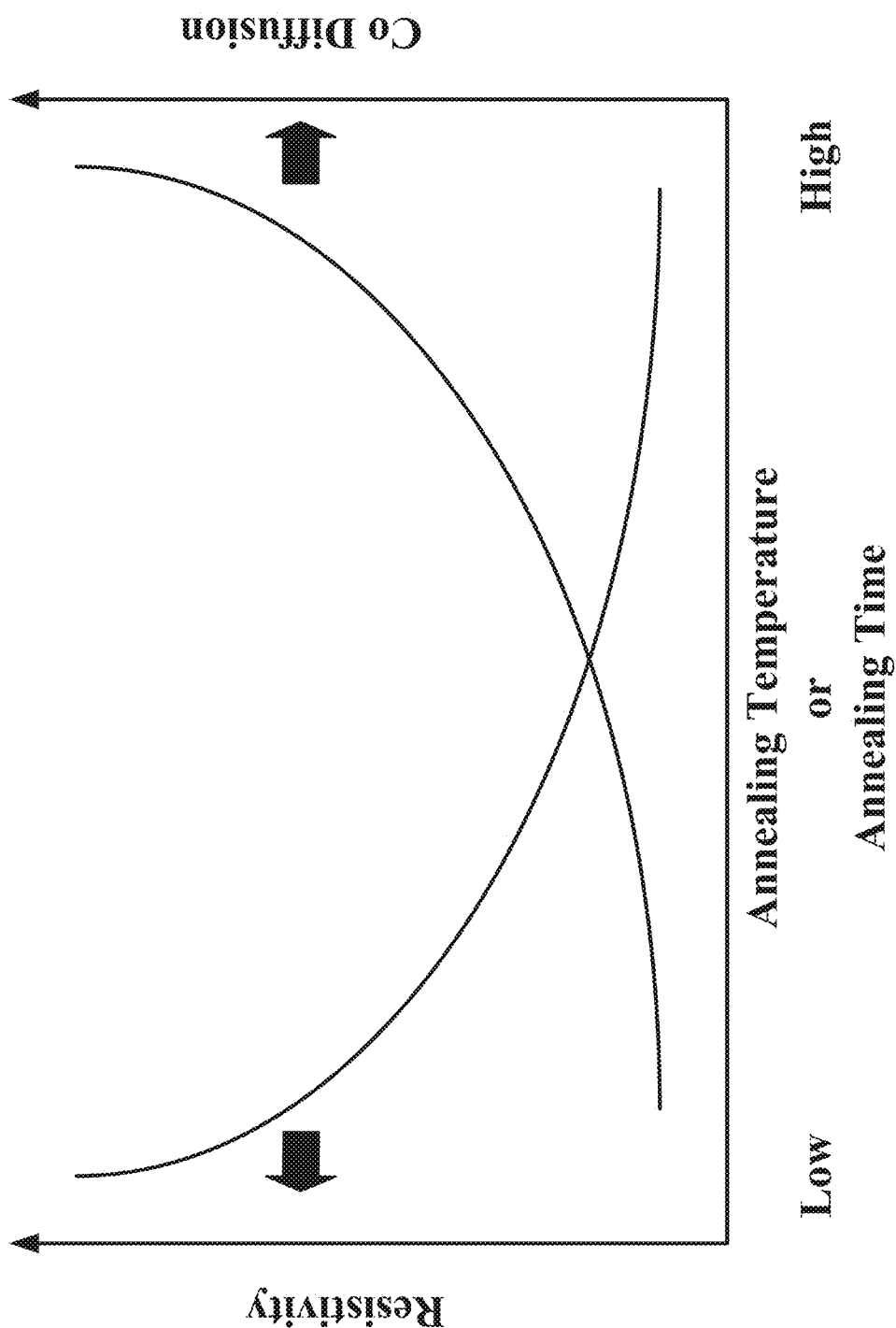
FIG. 13 shows trends for ruthenium resistivity and cobalt out-diffusion as a function of annealing temperature and/or annealing time, in accordance with some embodiments.

In some embodiments, the ruthenium electrical resistivity reduces for higher annealing temperatures and/or longer annealing times due to the grain growth process. At the same time, cobalt out-diffusion increases under the same annealing conditions. This behavior for the ruthenium electrical resistivity and cobalt out-diffusion is captured in FIG. 13 where trends for the ruthenium electrical resistivity and cobalt out-diffusion are shown as a function of the annealing temperature for a fixed annealing time or as a function of the annealing time for a fixed annealing temperature. It is therefore paramount that the annealing temperature and the annealing time are controlled to achieve a balance between the desirable electrical properties for the ruthenium fill and the "undesirable" cobalt out-diffusion. In some embodiments, high annealing temperatures (e.g., higher than about 360° C.) or long annealing times (e.g., longer than 10 min) mitigate the resistivity benefits achieved by the grain growth process due to the cobalt out-diffusion process. In some embodiments, annealing times longer than about 10 min, even at a low annealing temperature of about 200° C., can result in cobalt out-diffusion without providing additional contact resistance benefits. In addition to the above, longer annealing times (e.g., longer than 10 min) unnecessarily increase the duration of the annealing process, which in turn results in a higher fabrication cost. Conversely, annealing times shorter than about 1 min may not allow the ruthenium grains to substantially grow and reduce the electrical resistivity of ruthenium metal 110. In some embodiments, annealing conditions that include an annealing temperature between about 200° C. and about 360° C. combined with the appropriate annealing time as discussed above result in a cobalt concentration within ruthenium metal 110 of less than about 6 atomic percent (at. %).

In some embodiments, the selection of the annealing temperature depends on the volume of ruthenium metal 110 to be annealed. For example, a high aspect ratio contact (e.g., with an aspect ratio of about 5 or 6) containing more ruthenium metal may require a high annealing temperature (e.g., closer to about 360° C.) and a short annealing time (e.g., between about 1 min and about 5 min). Conversely, a low aspect ratio via (e.g., with an aspect ratio of about 3) containing less ruthenium metal may require a low annealing temperature (e.g., closer to about 200° C.) and a long annealing time (e.g., between about 5 min and about 10 min). Since it possible for high and low aspect ratio liner-free conductive structures to coexist on the same substrate, a selection of an appropriate annealing temperature and annealing time combination provides a favorable contact resistance for liner-free conductive structures with higher and lower aspect ratios.

Figure 14:
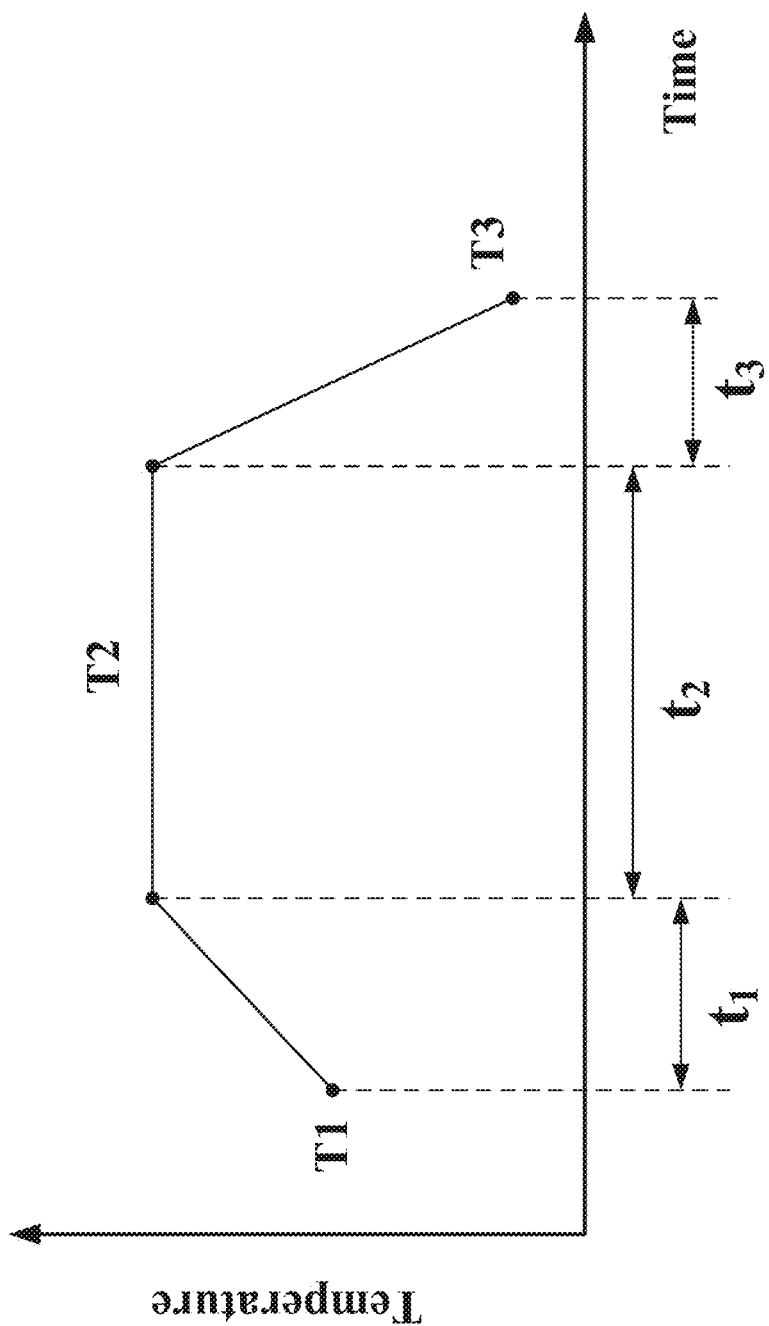
FIG. 14 is a graphical representation of an annealing process for liner-free conductive structures, in accordance with some embodiments.

According to some embodiments, FIG. 14 is a graphical representation of the annealing process described above. In some embodiments, after the deposition of ruthenium metal 110, the wafer (e.g., the substrate) is transferred to an annealing reactor. By way of example and not limitation, the annealing reactor can be located on the same mainframe as the deposition reactor or on a different mainframe. In some embodiments, the annealing reactor is a single wafer reactor or batch reactor (e.g., a furnace). The wafer enters the annealing reactor at a temperature T1 that corresponds to a temperature lower than that of the ruthenium metal deposition (e.g., less than about 200° C.) and higher than room temperature (e.g., higher than about 24° C.). Subsequently, the wafer is heated to the annealing temperature T2. The heating process has a duration $t_1$ that ranges from about 30 s to about 60 s depending on the annealing reactor design and capabilities. The wafer is then annealed at the target annealing temperature T2 (e.g., between about 200° C. and about 360°) for an annealing time $t_2$, which ranges from about 1 min to about 10 min depending on annealing temperature T2 as discussed above. When the annealing process ends, the wafer is cooled to temperature T3 that corresponds to room temperature (e.g., about 24° C.). The duration $t_3$ of the cooling process ranges from about 30 s to about 60 s depending on the annealing reactor design and capabilities. At that point, the wafer is removed from the annealing reactor. In some embodiments, annealing temperature T2 is controlled within 5° C. or less to ensure the accuracy and repeatability of the annealing process. As discussed above, the annealing process is performed in a non-oxidizing ambient that includes $N_2$, Ar, He, Hz, a forming gas, or any combinations thereof at a pressure between about 2 Torr and about 20 Torr.

The annealing process described in FIG. 14. is not limiting. For example, the heating (ramp-up) and/or cooling (ramp-down) processes may not be linear. Therefore, non-linear heating and/or cooling processes are within the spirit and the scope of this disclosure.

As discussed above, another reason for the annealing process is to grow an interfacial ruthenium oxide layer between ruthenium metal 110 and ILD 155. In some embodiments, during the annealing process, oxygen from ILD 155 bonds with the ruthenium metal atoms to form an interfacial ruthenium oxide layer. In some embodiments, the thickness of the interfacial ruthenium oxide layer is less than about 1 nm. In some embodiments, the thickness of the ruthenium oxide layer can be challenging to determine due to the poor interface separation between ruthenium metal 110 and the ruthenium oxide layer by electron microscopy based techniques, such as scanning electron microscopy (SEM) and transmission electron microscopy (TEM).

Figure 10:
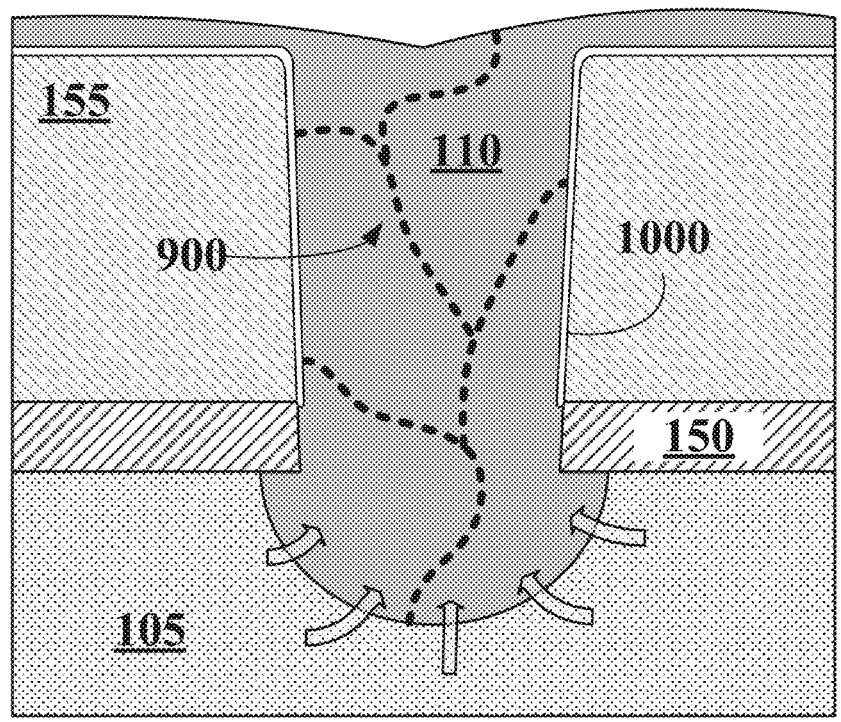

FIG. 10 shows the structure of FIG. 9 during the annealing process described above with respect to operation 260. As shown in FIG. 10, the grain boundaries represented by dashed lines 900 coalesce as the grain size of ruthenium metal 110 increases. Cobalt atoms diffuse from cobalt conductive structure 105 into ruthenium metal 110 as indicated by arrows at the interface between ruthenium metal 110 and cobalt conductive structure 105. Further, a ruthenium oxide layer 1000 forms at the interface between ruthenium metal 110 and ILD 155. In some embodiments, ruthenium oxide is not formed at the interface between ruthenium metal 110 and etch stop layer 150 because etch stop layer 150 does not contain oxygen.

Contrary to other metals—such as tungsten, aluminum, and copper—whose oxides are not conductive, the oxide of ruthenium metal is conductive. For example, even though the electrical resistivity of ruthenium oxide is higher than that of ruthenium, ruthenium oxide is more conductive compared to a liner or barrier layer such as titanium nitride or tantalum nitride. Further, since ruthenium oxide layer 1000 occupies a small fraction of the total volume of ruthenium metal 110, the impact of the ruthenium oxide layer on the overall resistance can be negligible. As discussed above, a benefit of ruthenium oxide layer 1000 is that it improves the adhesion between ruthenium metal 110 and ILD 155, which can be beneficial during a ruthenium planarization process. For example, a planarization process, such as a CMP process, used to remove the ruthenium metal overburden over ILD 155 can create mechanical or capillary forces of sufficient magnitude to pull-out ruthenium metal 110 from the contact opening. The hemi-spherical or arcuate shaped anchor points and ruthenium oxide layer 1000 can prevent pull-out of ruthenium metal 110 during the planarization process.

In referring to FIG. 2B, method 200 continues with operation 270 and the process of planarizing ruthenium metal 110 so that the top surface of ruthenium metal 110 and the top surface of ILD 155 are substantially coplanar as shown in FIG. 11. According to some embodiments, FIG. 11 shows the final liner-free conductive structure 100. In some embodiments, the planarization process is a CMP process that removes excess ruthenium metal deposited on ILD 155 and planarizes the top surface of the resulting structure. In some embodiments, the planarization process of operation 270 reduces the height of ILD 155 to about half, or less than half, of its original height. For example, if the original height of ILD 155 was about 50 nm, the height of ILD 155 after the planarization process of operation 270 can be reduced to about 30 nm or less (e.g., to about 20 nm). This height reduction can change the aspect ratio of the resulting liner-free conductive structure 100 shown in FIGS. 1A, 1B, and 1C.

In referring to FIG. 11, grain boundaries represented by dashed lines 900 have been reduced compared to the pre-anneal ruthenium metal 110 shown in FIG. 9. This reduction is a result of the grain growth that occurred during the annealing process described in operation 260. Further, as discussed above, some cobalt diffusion occurs under the annealing conditions described in operation 260. As a result, pockets of cobalt atoms 1100, as shown in FIG. 11, can be formed along the interface between ruthenium metal 110 and cobalt conductive structure 105, along the sidewall and top surfaces of liner-free conductive structure 100 and along the grain boundaries of ruthenium metal 900. In some embodiments, traces of cobalt can be detected within ruthenium metal 110 in the aforementioned locations by energy-dispersive X-ray spectrometry (EDS, EDX, EDXS, or)(EDS). In some embodiments, about 1 to about 3 monolayers of cobalt are formed along the ruthenium grain boundaries.

In some embodiments, operations 260 and 270 can be performed in reverse order. For example, the annealing process of operation 260 can be performed after the planarization process of operation 270. In some embodiments, if the planarization process is performed prior to the annealing process, ruthenium metal 110 would be lacking ruthenium oxide layer 1000, which functions as an adhesive layer that prevents ruthenium metal pull-out.

In some embodiments, after the planarization process of operation 270, a metal oxide etch stop layer 1200 is blanket deposited on ILD 155 to cover liner-free conductive structures 100 as shown in FIGS. 12A and 12B. By way of example and not limitation, metal oxide etch stop layer 1200 can include an aluminum oxide ($Al_2O_3$) layer with a thickness of about 3 nm. In some embodiments, metal oxide etch stop layer 1200 functions as a capping layer that suppresses cobalt agglomeration on top surfaces of liner-free conductive structures 100 and the formation of cobalt nodules at the free surface of ruthenium metal 110. This is because metal oxide etch stop layer 1200 is configured to block cobalt atoms from diffusing through the top surfaces of liner-free conductive structures 100, even when liner-free conductive structures 100 undergo additional annealing cycles—e.g., during subsequent processing. In some embodiments, cobalt agglomeration is prevented even when the subsequent annealing cycles are performed at temperatures exceeding about 400° C. In some embodiments, since the diffused cobalt atoms are trapped within the liner-free conductive structure 110, the cobalt diffusion process reaches a saturation point and ceases.

In some embodiments, additional layers can be formed on metal oxide etch stop layer 1200, such as an inter-metal dielectric (IMD) 1210 shown in FIGS. 12A and 12B. IMD 1210 can include a low-k dielectric (e.g., a dielectric with a dielectric constant less than about 3.9), such as carbon containing silicon oxide. Additional conductive structures can be formed within IMD 1210 to connect liner-free conductive structures 100 to upper metallization levels not shown in FIGS. 12A and 12B.

As discussed above with respect to FIGS. 1B and 1C, FIGS. 12A and 12B show details of anchor point 160 along different cutting locations. As shown in FIG. 12A, the arcuate or semi-spherically shape of anchor point 160 is restricted by the width of cobalt conductive structures 105 along the x-direction. This is because the width of cobalt conductive structures 105 along the x-direction can be narrower than the width of anchor point 160. In contrast, in FIG. 12B, the arcuate or semi-spherically shape of anchor point 160 is not restricted by the length of cobalt conductive structures 105. Based on the above, and depending on the cutting direction, the anchor point 160 may appear to have a different shape. For cobalt conductive structures 105 with a width larger than the width of anchor point 160, the shape of anchor point 160 would appear similar to that shown in FIG. 12B for any cutting direction (e.g., x or y).

According to some embodiments, the dimensions of anchor point 160 shown in FIGS. 12A and 12B are similar to those discussed with respect to the anchor recess in FIGS. 8A and 8B. For example, width $W_y$ along the y-direction corresponds to anchor recess width A shown in FIG. 8A (e.g., between about 21 nm and about 39 nm), and width $W_x$ along the x-direction corresponds to anchor recess width C shown in FIG. 8B. In some embodiments, $W_x$ and C are substantially equal to a top width of cobalt conductive structure 105 as shown in FIG. 12A. Further, height H' of anchor point 160 corresponds to anchor recess height H shown in FIG. 8A (e.g., between 7 nm and about 13 nm), and anchor recess width 600bw in FIG. 8A corresponds to the width L of anchor point 160 at the same location (e.g., between 13 nm and about 15 nm). In some embodiments, ratio $W_y$/H' is about 3. In some embodiments, a ratio $W_y$/H' greater than about 3 results in a wider and shallower anchor point 160, which can be challenging to form due to the isotropic nature of the etching process. On the other hand, a ratio $W_y$/H' less than about 3 result in a narrower and deeper anchor point 160, which can make liner-free conductive structure 110 more susceptible to pull-out during ruthenium CMP. In some embodiments, ratio $W_y$/L ranges from about 1.7 to about 2.6. In some embodiments, ratios $W_y$/L less than about 1.7 result in a narrower anchor point 160, which can make liner-free conductive structure 110 more susceptible to pull-out during ruthenium CMP. On the other hand, ratios $W_y$/L greater than about 2.6 result in an enlarged anchor point, which can be more challenging to fill. In some embodiments, ratio L/H' ranges from about 1 to about 2.

In some embodiments, an undercut having a width along the y-direction of about $(W_y-L)/2$ is formed on each side of the anchor point 160 below etch stop layer 150. In some embodiments, the undercut in the x- and y-directions ranges from about 4 nm to about 12 nm. In some embodiments, an undercut less than about 4 nm may not prevent liner-free conductive structure 110 from being pull-out during a CMP process, while an undercut greater than about 12 nm can be more challenging to form by isotropic etching and subsequently fill with ruthenium metal.

In some embodiments, liner-free conductive structures 100 offer lower resistance than conductive structures filled with other metals (e.g., tungsten) that require one or more liner or barrier layers. By way of example and not limitation, the resistance of a single liner-free conductive structure 100 can be less than about 80Ω (e.g., about 60Ω) depending on the aspect ratio of the liner-free conductive structure.

Liner-free conductive structures 100 fabricated with method 200 are not limited to cobalt source/drain contacts. For example, liner-free conductive structures 100 can be formed using method 200 on cobalt gate contacts or any other type of cobalt conductive structure used in integrated circuits.

Various embodiments in accordance with this disclosure describe a method for the fabrication of liner-free or barrier-free conductive structures. In some embodiments, the liner-free or barrier-free conductive structures are filled with ruthenium metal deposited directly on cobalt conductive structures without the use of intervening layers, such as adhesion layers, liner layers, or barrier layers. In some embodiments, the ruthenium metal fill is annealed at an annealing temperature between about 200° C. and about 360° C. for about 5 min to reduce the electrical resistivity of the ruthenium metal and to form a ruthenium oxide layer between the ruthenium metal and the surrounding ILD. In some embodiments, the ruthenium oxide layer improves the adhesion of the ruthenium metal to the surrounding ILD. According to some embodiments, annealing temperatures between about 200° C. and about 360° C. can promote grain growth but, at the same time, mitigate cobalt out-diffusion from the underlying cobalt conductive structures. The liner-free or barrier-free conductive structures include anchor points, which help mitigate the ruthenium metal pull-out during a subsequent ruthenium metal planarization process.

In some embodiments, a method includes depositing an etch stop layer on a cobalt contact disposed on a substrate, depositing a dielectric on the etch stop layer, etching the dielectric and the etch stop layer to form an opening that exposes a top surface of the cobalt contact, and etching the exposed top surface of the cobalt contact to form a recess in the cobalt contact extending laterally under the etch stop layer. The method further includes depositing a ruthenium metal to substantially fill the recess and the opening, and annealing the ruthenium metal to form an oxide layer between the ruthenium metal and the dielectric.

In some embodiments, a method includes forming a conductive structure with a first metal on a substrate and forming a liner-free conductive structure on the conductive structure, where the liner-free conductive structure includes a second metal different from the first metal. Further, forming the liner-free conductive structure includes depositing an etch stop layer on the conductive structure, depositing a dielectric layer on the etch stop layer, performing a first etch to form a via opening in the dielectric and the etch stop layer that exposes the first metal, and performing a second etch through the via opening to form a recess in the conductive structure. The method further includes depositing the second metal to substantially fill both the recess and the via opening, where the second metal is deposited in physical contact with the second metal, the etch stop layer and the dielectric layer. The method also includes annealing the second metal to lower a resistance of the second metal.

In some embodiments, a structure includes a contact with a first metal disposed on a substrate, a liner-free via formed within the contact. Further, the liner-free via includes a second metal in physical contact with the first metal and a first metal oxide layer surrounding portions of the second metal not in contact with the first metal. The structure also includes a second metal oxide disposed on a top surface of the second metal.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor device, comprising:
a substrate;
a source/drain (S/D) region disposed on the substrate;
a first conductive structure comprising a first metal layer disposed on the S/D region;
an etch stop layer disposed on the first conductive structure;
a second conductive structure, disposed in the first conductive structure and the etch stop layer, comprising:
a second metal layer different from the first metal layer; and
a plurality of pockets of atoms of a metal of the first metal layer disposed along sidewalls and a bottom surface of the etch stop layer and along grain boundaries in the second metal layer, wherein the plurality of pockets of atoms comprises a concentration of the metal less than about 6 atomic percent; and
a metal oxide layer disposed on the second conductive structure.

2. The semiconductor device of claim 1, wherein the first metal layer comprises a cobalt layer.

3. The semiconductor device of claim 1, wherein the second metal layer comprises a ruthenium layer.

4. The semiconductor device of claim 1, wherein the metal oxide layer comprises an aluminum oxide layer.

5. The semiconductor device of claim 1, further comprising a nitride layer disposed on the first conductive structure, wherein a portion of the second conductive structure extends laterally under the nitride layer.

6. The semiconductor device of claim 1, further comprising a conductive metal oxide layer surrounding portions of the second metal layer.

7. The semiconductor device of claim 1, wherein the second conductive structure comprises a base portion disposed in the first conductive structure; and
wherein the base portion comprises a semi-spherical shaped cross-sectional profile.

8. The semiconductor device of claim 1, wherein the second conductive structure comprises a base portion disposed in the first conductive structure; and
wherein the base portion comprises a bottom surface with a curved cross-sectional profile and sidewalls with a linear cross-sectional profile.

9. The semiconductor device of claim 1, wherein the second conductive structure extends a vertical distance of about 7 nm to about 13 nm from a top surface of the first conductive structure into a body of the first conductive structure.

10. The semiconductor device of claim 1, wherein the second conductive structure extends laterally under the etch stop layer by a lateral distance of about 4 nm to about 12 nm.

11. A semiconductor device, comprising:
a substrate;
a fin structure disposed on the substrate;
a source/drain (S/D) region disposed on the fin structure;
a contact structure comprising a first metal layer disposed on the S/D region;
a nitride layer disposed on the contact structure; and
a via structure, disposed in the contact structure, comprising:
a second metal layer different from the first metal layer; and
pockets of atoms of a metal of the first metal layer disposed along an interface between the first metal layer and the second metal layer and along sidewalls and a bottom surface of the nitride layer, wherein the pockets of atoms comprise a concentration of the metal less than about 6 atomic percent.

12. The semiconductor device of claim 11, wherein the first metal layer comprises a cobalt layer.

13. The semiconductor device of claim 11, wherein the second metal layer comprises a ruthenium layer.

14. The semiconductor device of claim 11, further comprising a dielectric layer surrounding the via structure and disposed on the contact structure.

15. The semiconductor device of claim 14, further comprising a conductive oxide layer disposed at an interface between the dielectric layer and the via structure.

16. The semiconductor device of claim 15, wherein the conductive oxide layer comprises a ruthenium oxide layer.

17. A semiconductor device, comprising:
a substrate;
a fin structure disposed on the substrate;
a source/drain (S/D) region disposed on the fin structure;
a cobalt structure disposed on the S/D region;
a ruthenium structure disposed in the cobalt structure;
a conductive oxide layer disposed along a sidewall of the ruthenium structure; and
a plurality of pockets of cobalt atoms disposed on the conductive oxide layer and along a grain boundary in the ruthenium structure, wherein the plurality of pockets of cobalt atoms comprises a cobalt concentration less than about 6 atomic percent.

18. The semiconductor device of claim 17, wherein the ruthenium structure extends a vertical distance of about 7 nm to about 13 nm from a top surface of the cobalt structure into a body of the cobalt structure.

19. The semiconductor device of claim 17, further comprising an oxygen-free etch stop layer disposed on the cobalt structure, wherein the ruthenium structure extends laterally under the oxygen-free etch stop layer by a lateral distance of about 4 nm to about 12 nm.

20. The semiconductor device of claim 17, further comprising an aluminum oxide layer disposed on the ruthenium structure.

* * * * *